(12) United States Patent
Suzuki et al.

(10) Patent No.: US 9,112,673 B2
(45) Date of Patent: Aug. 18, 2015

(54) RECEPTION CIRCUIT

(71) Applicant: FUJITSU LIMITED, Kawasaki-shi, Kanagawa (JP)

(72) Inventors: Shigeto Suzuki, Kawasaki (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/334,761

(22) Filed: Jul. 18, 2014

(65) Prior Publication Data

US 2015/0043695 A1  Feb. 12, 2015

(30) Foreign Application Priority Data

Aug. 9, 2013 (JP) .................................. 2013-166539

(51) Int. Cl.
*H04L 7/02* (2006.01)
*H04B 1/16* (2006.01)
*H04L 7/00* (2006.01)

(52) U.S. Cl.
CPC .. *H04L 7/02* (2013.01); *H04B 1/16* (2013.01); *H04L 7/0025* (2013.01); *H04L 7/0079* (2013.01)

(58) Field of Classification Search
CPC ....... H04L 7/0004; H04L 7/10; H04L 7/0025; H04L 7/0049; H04L 7/02; H04B 1/16

USPC ........... 375/355, 376, 371, 373; 327/147, 156
See application file for complete search history.

(56) References Cited

U.S. PATENT DOCUMENTS 5,579,348 A * 11/1996 Walker et al. ................. 375/355
2008/0232524 A1* 9/2008 Liu et al. ....................... 375/355

FOREIGN PATENT DOCUMENTS

JP   11-196142   7/1999
JP   2012-054720  3/2012

* cited by examiner

*Primary Examiner* — Betsy Deppe
(74) *Attorney, Agent, or Firm* — Fujitsu Patent Center

(57) ABSTRACT

A reception circuit has: a phase detector that detects a phase code based on a phase of data in relation to a first clock signal; a calibration signal generator that, in a calibration mode, adjusts a frequency of the first clock signal or the data so that the phase code detected by the phase detector changes; a calibrator that, in the calibration mode, stores a difference between the phase code and an ideal value of the detected phase, and that, in a normal operation mode, outputs the ideal value in correspondence with the phase code detected by the phase detector; and a phase adjustor that, in the normal operation mode, adjusts a phase of the first clock signal based on the phase code detected by the phase detector and the ideal value, and that outputs to the phase detector.

6 Claims, 10 Drawing Sheets

F I G. 3

| PHASE (°) | PH2(7bit) | PA1(3bit) | PA2(3bit) | PA3(3bit) | PH5(3bit) |
|---|---|---|---|---|---|
| 0 | 0000000 | 100 | 100 | 000 | 000 |
| 2.8 | 0000001 | 100 | 100 | 000 | 000 |
| 5.6 | 0000010 | 100 | 100 | 000 | 000 |
| 8.4 | 0000011 | 100 | 100 | 000 | 000 |
| 11.2 | 0000100 | 100 | 100 | 000 | 000 |
| 14.0 | 0000101 | 100 | 100 | 000 | 000 |
| 16.9 | 0000110 | 100 | 101 | 001 | 001 |
| ... | ... | ... | ... | ... | ... |
| 67.5 | 0011000 | 100 | 110 | 010 | 010 |
| 70.3 | 0011001 | 100 | 110 | 010 | 010 |
| 73.1 | 0011010 | 100 | 111 | 011 | 011 |
| 76.0 | 0011011 | 100 | 111 | 011 | 011 |
| 78.8 | 0011100 | 100 | 111 | 011 | 011 |
| 81.6 | 0011101 | 100 | 111 | 011 | 011 |
| 84.4 | 0011110 | 100 | 111 | 011 | 011 |
| 87.2 | 0011111 | 100 | 111 | 011 | 011 |
| ... | ... | | | | |

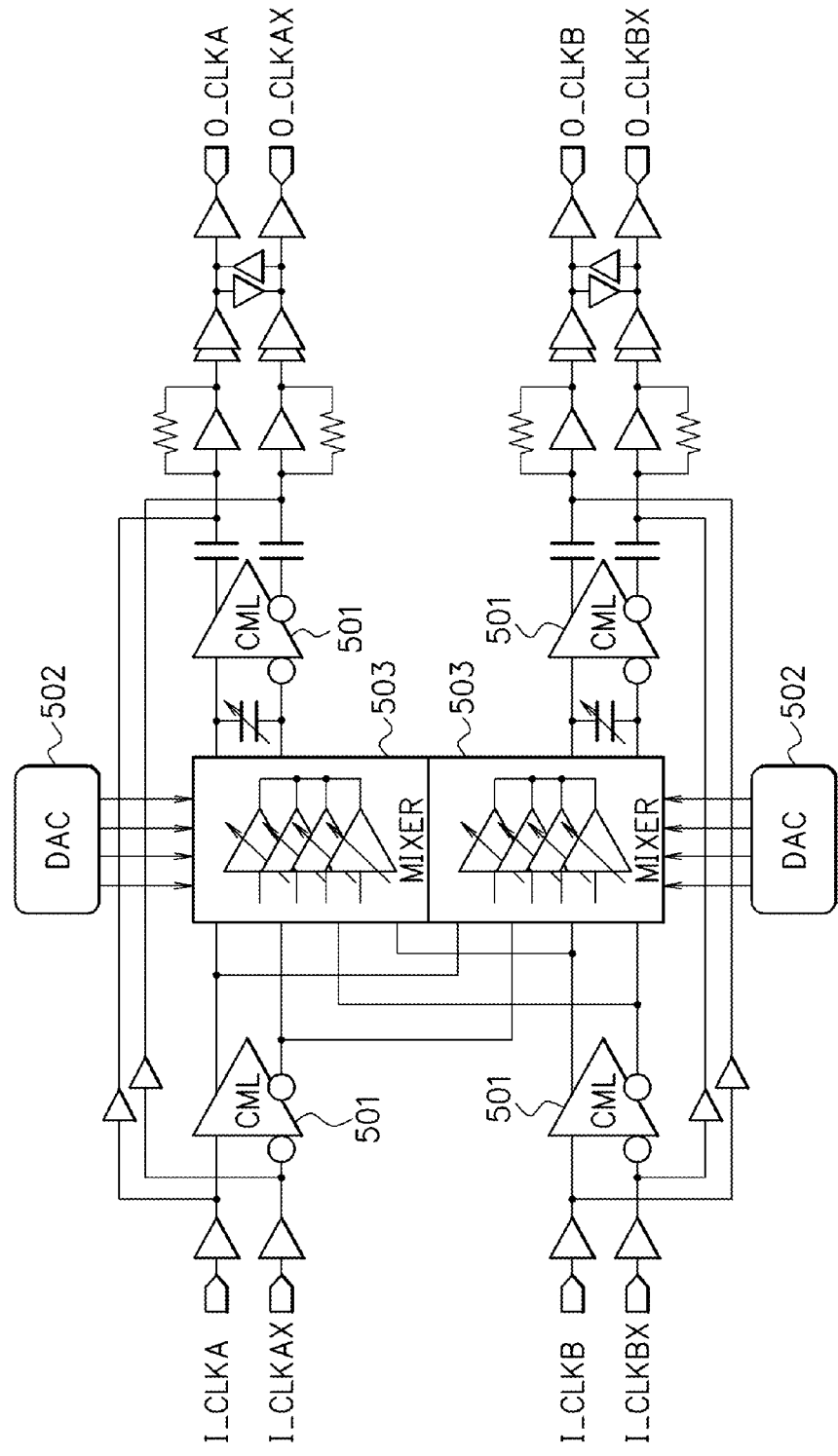
F I G. 5

F I G. 6A
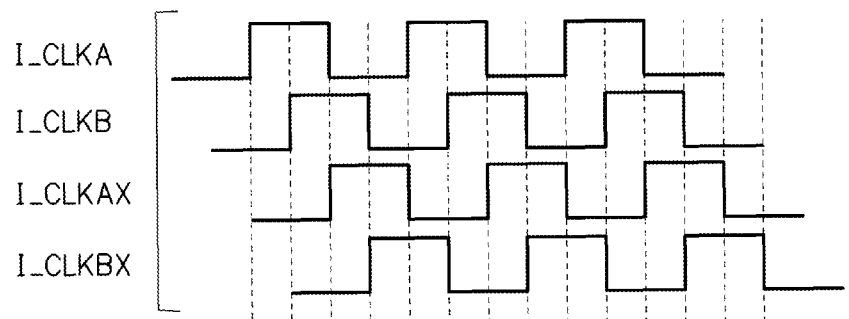
F I G. 6B
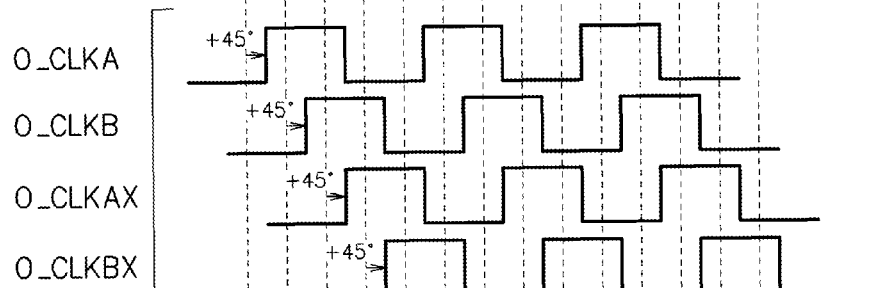
F I G. 6C
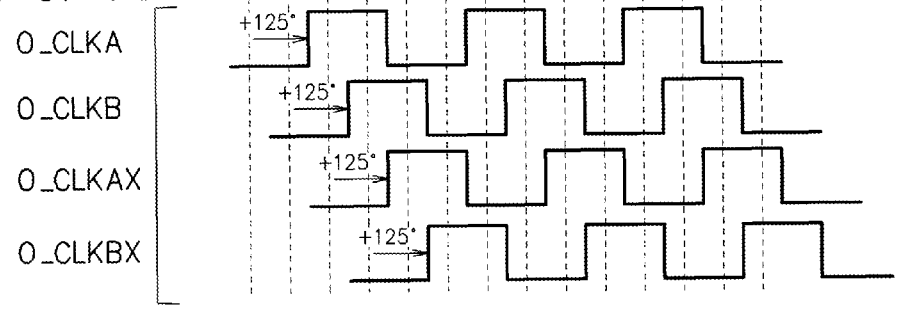

F I G. 10
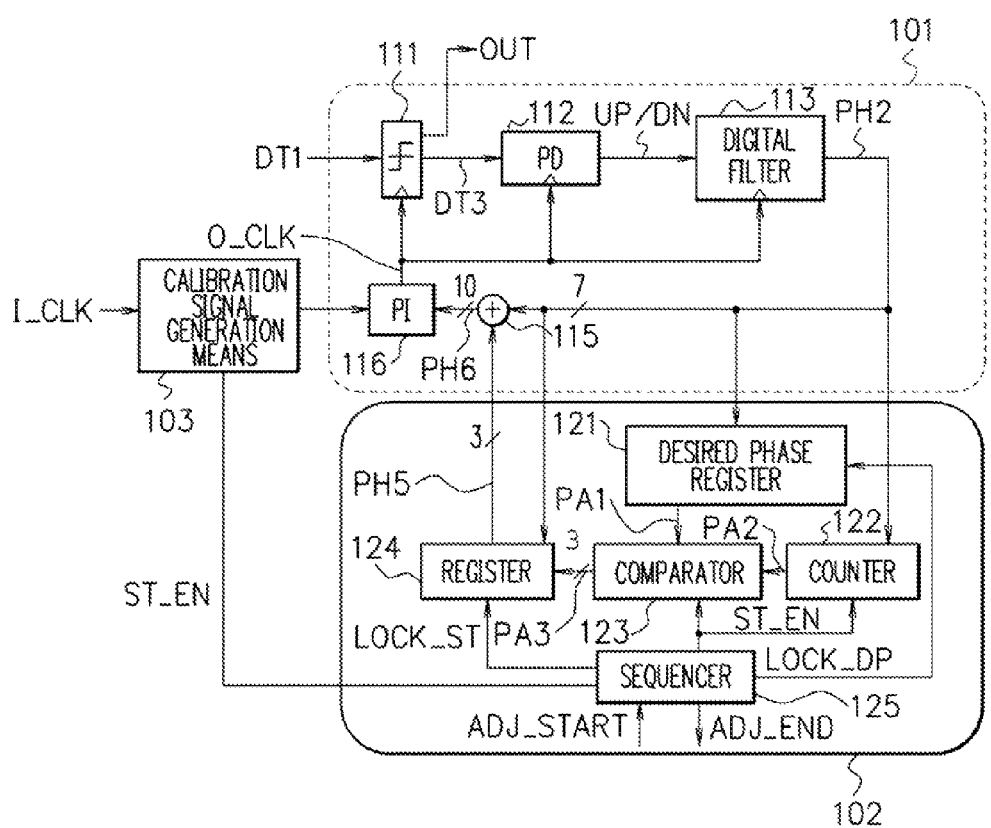

RECEPTION CIRCUIT

CROSS-REFERENCE TO RELATED APPLICATION

This application is based upon and claims the benefit of priority of the prior Japanese Patent Application No. 2013-166539, filed on Aug. 9, 2013, the entire contents of which are incorporated herein by reference.

FIELD

The embodiment discussed herein is directed to a reception circuit.

BACKGROUND

There is known a reception circuit which has a phase interpolator that generates a polyphase clock output signal of an arbitrary phase from a polyphase clock input signal based on a phase code and a phase fluctuation circuit that gives a fluctuation to a phase code (see Patent Document 1, for example). A phase detection circuit detects a fluctuation of the polyphase clock output signal in relation to the fluctuation of the phase code. A distortion estimation circuit estimates a phase distortion of the phase interpolator based on a detection result of the phase detection circuit. A correction circuit corrects the phase distortion based on an estimation result of the distortion estimation circuit.

Further, there is known a wave detector which gives a symbol sample synchronized with a baud timing by interpolation from an over-sample series of a PSK signal standardized asynchronously with a time of the baud timing (see Patent Document 2, for example). A zero cross phase is estimated from an output wave of a clock extraction means by a straight line interpolation unit of a phase estimation means, and phase difference data is outputted. A stored value of an approximate interpolation ROM, in which an error amount of straight-line approximation is stored, is added to the phase difference data, and a linear interpolation coefficient ROM is referred to.

[Patent Document 1] Japanese Laid-open Patent Publication No. 2012-54720

[Patent Document 2] Japanese Laid-open Patent Publication No. 11-196142

In Patent Document 1, an analog-digital conversion unit analog-digital converts data in synchronicity with the polyphase clock output signal generated by the phase interpolator. A data judgment circuit performs data judgment to output data of the analog-digital conversion unit. Since a phase distortion of the phase interpolator causes a data judgment error, it is necessary to interpolate the phase distortion of the phase interpolator at a high accuracy.

SUMMARY

A reception circuit has: a phase detector that detects a phase code based on a phase of data in relation to a first clock signal; a calibration signal generator that, in a calibration mode, adjusts a frequency of the first clock signal or the data so that the phase code detected by the phase detector changes; a calibrator that, in the calibration mode, stores a difference between the phase code detected by the phase detector and an ideal value of the detected phase, and that, in a normal operation mode, outputs the ideal value in correspondence with the phase code detected by the phase detector; and a phase adjustor that, in the normal operation mode, adjusts a phase of the first clock signal based on the phase code detected by the phase detector and the ideal value, and that outputs to the phase detector.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a table for explaining an operation of a calibration circuit of FIG. 1;

FIG. 5 is a diagram which depicts a configuration example of a phase adjustment circuit of FIG. 1;

FIG. 6A to FIG. 6C are diagrams which depict examples of a clock signal;

FIG. 10 is a diagram which depicts a configuration example of still another reception circuit.

DESCRIPTION OF EMBODIMENTS

Figure 1:
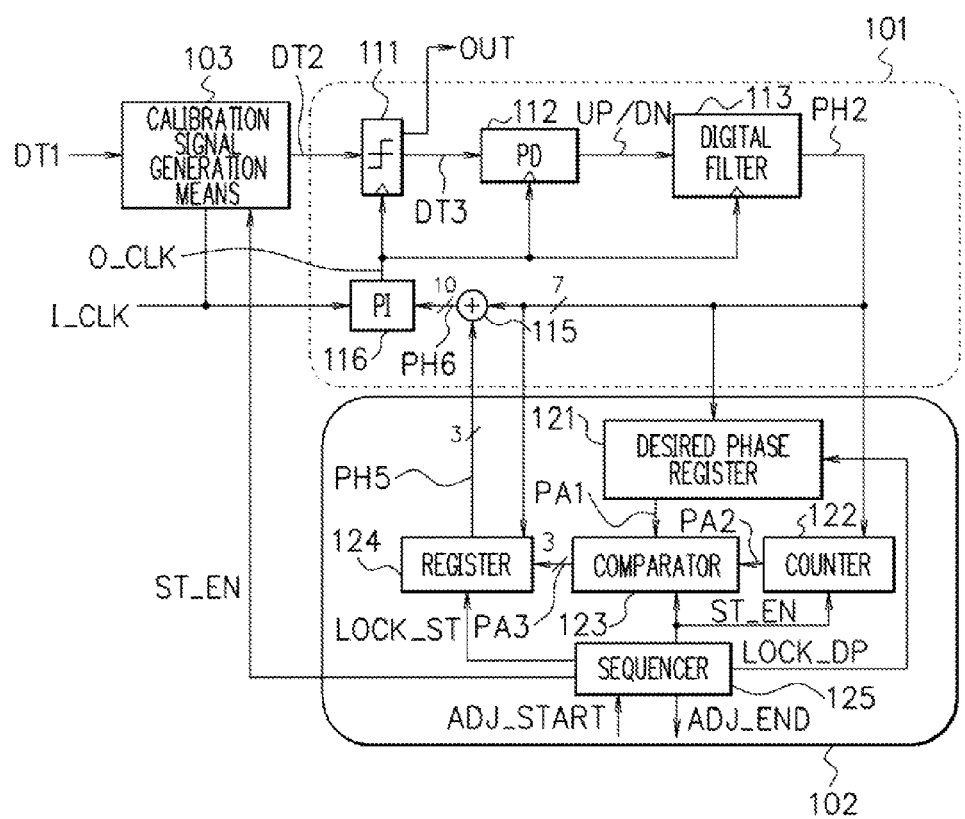
FIG. 1 is a diagram which depicts a configuration example of a reception circuit according to the present embodiment.

FIG. 1 is a diagram which depicts a configuration example of a reception circuit according to the present embodiment. The reception circuit has a clock data recovery circuit (CDR) 101, a calibration circuit 102, and a calibration signal generation means 103, and restores data OUT based on data DT1 received from a transmission circuit. The reception data DT1 has a data rate of 20 Gps, for example, and is asynchronous with a clock signal I_CLK. The reception circuit has a calibration mode and a normal operation mode. First, the normal operation mode will be described. In the normal operation mode, the calibration signal generation means 103 outputs the reception data DT1 without change as data DT2.

The clock data recovery circuit 101 has a judgment circuit 111, a phase detector 112, a digital filter 113, an adder 115, and a phase adjustment circuit (phase interpolation circuit) 116.

Figure 2A:
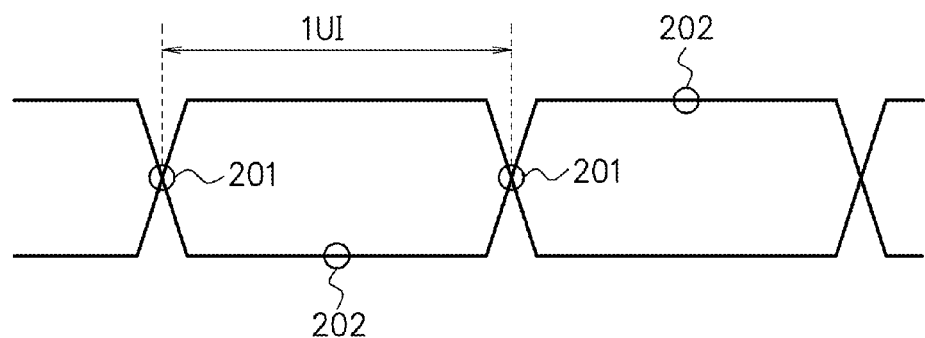
FIG. 2A to FIG. 2C are diagrams for explaining an operation of the reception circuit.

FIG. 2A is a data transition diagram of the data DT2. "1UI" indicates a period of 1-bit data. The data DT2 has boundary data 201 and center data 202. The boundary data 201 is data sampled at a data transition timing. The center data 202 is data sampled at a data center timing. The judgment circuit 111 is a flip-flop circuit, for example, and in synchronicity with a polyphase clock signal O_CLK, samples the boundary data 201 and the center data 202 to perform binary judgment, and outputs data DT3 to the phase detector (PD) 112. For example, the judgment circuit 111 judges data to be "1" when the data is larger than a threshold value, and judges the data to be "0" when the data is smaller than the threshold value. The center data 202, which cannot be judged correctly if sampled in the vicinity of the data transition timing, is preferable to be sampled in the vicinity of the center timing of 1UI. The phase adjustment circuit 116 adjusts a phase of the clock signal O_CLK so that the center data 202 can be sampled in the vicinity of the center timing. The boundary data 201 is sampled by a boundary clock signal in the polyphase clock signal O_CLK, and the center data 202 is sampled by a center clock signal in the clock signal O_CLK. Further, the judgment circuit 111 outputs a binary judgment result of the sampled center data 202 as restoration data OUT.

The phase detector 112 detects phase information UP/DN of data DT3 in relation to the clock signal O_CLK. More specifically, the phase detector 112 makes an up signal UP "1" and outputs when a data transition timing of the data DT3 is behind an edge of the boundary clock signal in the polyphase clock signal O_CLK, and makes a down signal DN "1" and outputs when the data transition timing of the data DT3 is ahead of the edge of the boundary clock signal in the polyphase clock signal O_CLK. The phase detector 112 checks one piece of boundary data 201 and two pieces of center data 202 before and after the boundary data 201 of FIG. 2A. For example, when the center data 202 before the boundary data 201 is of low level, the boundary data 201 thereafter is of low level, and the center data 202 thereafter is of high level, the data transition timing is judged to be behind a timing of the boundary clock signal in the polyphase clock signal O_CLK, and the up signal UP of "1" is outputted. In contrast, when the center data 202 before the boundary data 201 is of low level, the boundary data 201 thereafter is of high level, and the center data 202 thereafter is of high level, the data transition timing is judged to be ahead of a timing of the boundary clock signal in the polyphase clock signal O_CLK, and the down signal DN of "1" is outputted.

The digital filter 113, synchronizing with the clock signal O_CLK, integrates the phase information UP/DN outputted by the phase detector 112 by filtering, and outputs a phase code PH2. As depicted in FIG. 3, the phase code PH2 is a 7-bit digital code, for example. The phase code PH2 is incremented when the up signal UP is "1" and is decremented when the down signal DN is "1".

The adder 115 adds the 7-bit high-order phase code PH2 and a 3-bit low-order phase code PH5, and outputs a 10-bit phase code PH6. The low-order phase code PH5 is a calibration value of a phase distortion of the phase adjustment circuit 116. If there is no phase distortion of the phase adjustment circuit 116, the low-order phase code PH5 is "0". The phase adjustment circuit 116 is, for example, a phase interpolation circuit (PI), and inputs the clock signal I_CLK, phase-adjusts the clock signal I_CLK in correspondence with the phase code PH6, and outputs the clock signal O_CLK. Thereby, the clock signal O_CLK is phase-adjusted in a direction where the transition timing of the data DT3 and the edge timing of the boundary clock signal in the clock signal O_CLK coincide with each other. By phase adjustment of the phase adjustment circuit 116, the judgment circuit 111 samples the center data 202 in the vicinity of the data center timing, so that correct judgment can be performed.

Figure 2B:
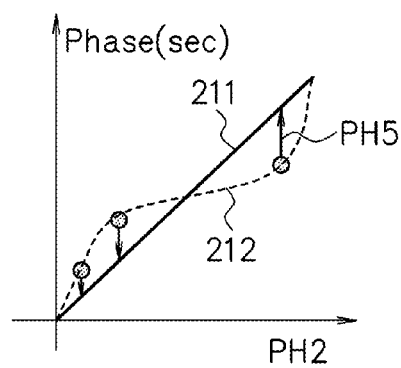

FIG. 2B is a diagram which depicts a calibration method of a phase distortion of the phase adjustment circuit 116. Ideally, the phase adjustment circuit 116 adjusts a phase of the clock signal O_CLK in proportion to the phase code PH2 as indicated by an ideal property 211, when the phase code PH 5 is "0". However, practically, the phase adjustment circuit 116 has a phase distortion in relation to the phase code PH2 as indicated by a practical property 212, when the phase code PH5 is "0". Thus, in the present embodiment, the adder 115 adds a calibration phase code PH5, and thereby the practical property 212 is calibrated to the ideal property 211, so that the phase distortion of the phase adjustment circuit 116 is calibrated.

Next, the calibration mode will be described. In the calibration mode, as described below, the aforementioned calibration phase code PH5 is generated. In the calibration mode, the calibration phase code PH5 is "0". A frequency of the clock signal O_CLK is the same as a frequency of the clock signal I_CLK.

Figure 2C:
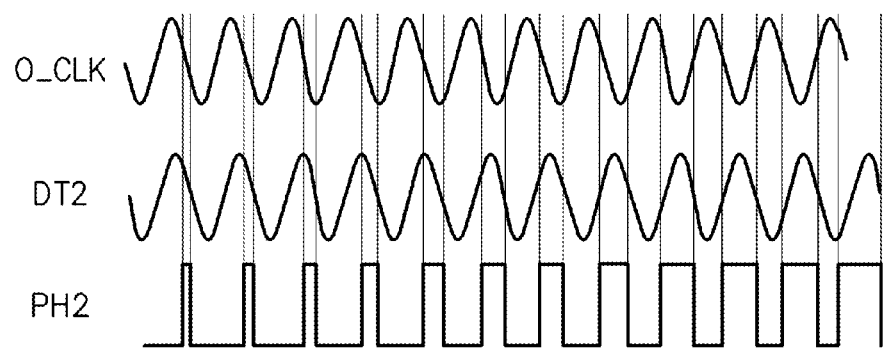

The calibration signal generation means 103, in the calibration mode, outputs a signal obtained by granting a frequency offset a to the clock signal I_CLK as data DT2. As depicted in FIG. 2C, the frequency of the clock signal O_CLK is f [Hz] and a frequency of the data DT2 is f+α [Hz]. As a result, the phase code PH2 outputted by the digital filter 113 changes in a manner to gradually become larger. As depicted in FIG. 3, the phase code PH2 outputted by the digital filter 113 increases by one per a predetermined time (per a phase of 2.8°).

A counter 122 counts a count value PA2 per change of the phase code PH2 as depicted in FIG. 3, under control of a sequencer 125. The 3-bit count value PA2 has the same bit accuracy as that of the 3-bit calibration phase code PH5. For example, during a period in which the phase code PH2 changes from "0000000" to "0000001", the counter 122 counts up from an initial value "0", and at a time that the phase code PH2 has changed to "0000001", outputs a count value PA2 of "100". The count value PA2 corresponds to the practical property 212 of FIG. 2B.

A register 121 stores an ideal value (expected value) PA1 of the count value PA2. Since the time for the phase code PH2 to change from "0000000" to "0000001" is of known value, the ideal value PA1 is stored per the phase code PH2. The ideal value PA1 is 3-bit. The ideal value PA1 corresponds to the ideal property 211 of FIG. 2B.

A comparator 123 outputs a difference PA3 obtained by subtracting the ideal value PA1 from the count value PA2 under control of the sequencer 125. The difference PA3 is 3-bit. The phase code PH2 whose difference PA3 is "0" indicates that there is no distortion, and the phase code PH2 whose difference PA3 is not "0" indicates that there is a phase distortion.

A register 124 stores the difference PA3 corresponding to the phase code PH2 as the calibration phase code PH5, under control of the sequencer 125. As depicted in FIG. 2C, since the frequency of the data DT2 is higher than the frequency of the clock signal O_CLK by the frequency offset a, the phase code PH2 increases by one as time passes. Therefore, after a predetermined time passes, the calibration phase codes PH5 corresponding to all the phase codes PH2 can be stored in the register 124.

By the above, the calibration mode ends. Thereafter, an operation of the above-described normal operation mode is carried out. In the normal operation mode, the calibration signal generation means 103 outputs the reception data DT1 without change as the data DT2. The register 124 outputs the calibration phase code PH5 corresponding to the phase code PH2. The adder 115 adds the 7-bit high-order phase code PH2 and the 3-bit low-order phase code PH5, and outputs the 10-bit phase code PH6 to the phase adjustment circuit 116. The phase adjustment circuit 116 performs phase adjustment in correspondence with the phase code PH6, and outputs the clock signal O_CLK. Thereby, the phase distortion of the phase adjustment circuit 116 can be calibrated. As depicted in FIG. 2B, by using the calibration phase code PH5, the practical property 212 can be calibrated to the ideal property 211.

By this calibration, phase displacement of the clock signal O_CLK is prevented and the judgment circuit 111 can sample the center data 202 at a proper timing, and thus judgment errors can be reduced.

Figure 4:
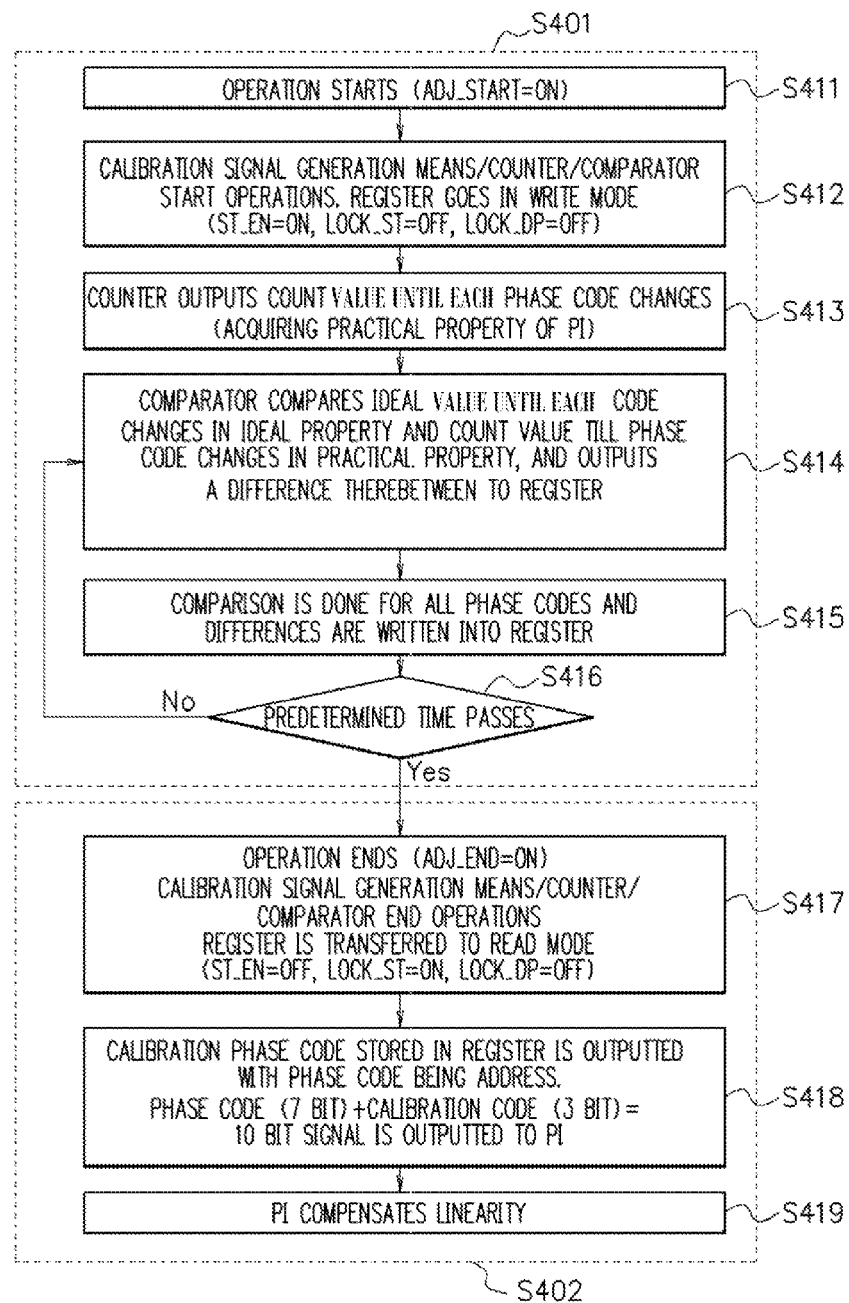
FIG. 4 is a flowchart which depicts a control method of the reception circuit of FIG. 1.

FIG. 4 is a flowchart which depicts a control method of the reception circuit of FIG. 1. The reception circuit first performs a processing of the calibration mode in a step S401, and next, performs a processing of the normal operation mode in a step S402. In the calibration mode, the step S401 includes steps S411 to S416. In the normal operation mode, the step S402 includes steps S417 to S419.

First, when a power is applied to the reception circuit, in the step S411, the sequencer 125 inputs an ON signal of a calibration operation start signal ADJ_START. Then, the process proceeds to the step S412.

In the step S412, the sequencer 125 outputs an ON signal of a signal ST_EN, an OFF signal of a signal LOCK_ST, and an OFF signal of a signal LOCK_DP. The calibration signal generation means 103, when inputting the ON signal of the signal ST_EN, outputs the data DT2 of f+α [Hz] depicted in FIG. 2C. The counter 122 and the comparator 123, when inputting the ON signal of the signal ST_EN, start operations. The register 121, when inputting the OFF signal of the signal LOCK_DP, changes into a reading mode and outputs the ideal value PA1 corresponding to the phase code PH2. The register 124, when inputting the OFF signal of the signal LOCK_ST, changes into a writing mode. The phase code PH5 outputted by the register 124 becomes "0".

Next, in the step S413, the counter 122 counts a count value until each phase code PH2 changes, and outputs the count value PA2. The count value PA2 corresponds to the practical property 212 of FIG. 2B.

Next, in the step S414, the comparator 123 compares the ideal value PA1 in the ideal property 211 outputted by the register 121 and the count value PA2 in the practical property 212 outputted by the counter 122, and outputs a difference PA3 therebetween to the register 124.

Next, in the step S415, the register 415 writes the differences PA3 of all the phase codes PH2 as the calibration phase codes PH5.

Next, in the step S416, the reception circuit checks whether or not a predetermined time has passed. If the predetermined time has not passed, the operation of the reception circuit after power application is not stable and the calibration phase code PH5 of a high accuracy has not been written into the register 124, and the process returns to the step S414. If the predetermined time has passed, the operation of the reception circuit is stable and the calibration phase code PH5 of a high accuracy has been written into the register 124, and thus the mode turns to the normal operation mode, the process proceeding to the step S417.

In the step S417, the sequencer 125 outputs an ON signal of a calibration operation end signal ADJ_END, and outputs an OFF signal of the signal ST_EN, an ON signal of the signal LOCK_ST, and an OFF signal of the signal LOCK_DP. The calibration signal generation means 103, when inputting the OFF signal of the signal ST_EN, outputs the reception data DT1 without change as the data DT2. The counter 122 and the comparator 123, when inputting the OFF signal of the signal ST_EN, end operations. The register 124, when inputting the ON signal of the signal LOCK_ST, comes into a reading mode.

Next, in the step S418, the register 124 inputs the phase code PH2 as an address, and outputs the calibration phase code PH5 corresponding to the phase code PH2. The adder 115 adds the 7-bit phase code PH2 and the 3-bit calibration phase code PH5, and outputs the 10-bit phase code PH6 to the phase adjustment circuit (PI) 116.

Next, in the step S419, the phase adjustment circuit 116 adjusts a phase of the clock signal O_CLK in correspondence with the phase code PH6. Thereby, a linearity (FIG. 2B) of the phase adjustment circuit 116 is compensated.

FIG. 5 is a diagram which depicts a configuration example of the phase adjustment circuit 116 of FIG. 1, and FIG. 6A to FIG. 6C are diagrams which depict examples of a clock signal. The phase adjustment circuit 116 is a phase interpolation circuit, for example, and has a buffer 501 of a current mode logic (CML), a digital-analog converter (DAC) 502, and a mixer 503.

Four-phase clock signals I_CLKA, I_CLKB, I_CLKAX, and I_CLKBX correspond to the clock signal I_CLK of FIG. 1. As depicted in FIG. 6A, the clock signal I_CLKA is a signal of 0°, the clock signal I_CLKB is a signal of 90°, the clock signal I_CLKAX is a signal of 180°, and the clock signal I_CLKBX is a signal of 270°. The buffer 501 of the CML converts the four-phase clock signals I_CLKA, I_CLKB, I_CLKAX, and I_CLKBX from voltages into currents. The digital-analog converter 502 converts the phase code PH6 from digital into analog, and outputs a weighting signal to the mixer 503. The mixer 503, in correspondence with the weighting signal, weights and adds the currents of the four-phase clock signals I_CLKA, I_CLKB, I_CLKAX, and I_CLKBX, respectively, and outputs four-phase clock signals O_CLKA, O_CLKB, O_CLKAX, and O_CLKBX. The four-phase clock signals O_CLKA, O_CLKB, O_CLKAX, and O_CLKBX correspond to the clock signal O_CLK of FIG. 1.

FIG. 6B depicts four-phase clock signals O_CLKA, O_CLKB, O_CLKAX, and O_CLKBX in a case where the phase code PH6 is "45°". The four-phase clock signals O_CLKA, O_CLKB, O_CLKAX, and O_CLKBX of FIG. 6B are delayed in relation to the four-phase clock signals I_CLKA, I_CLKB, I_CLKAX, and I_CLKBX of FIG. 6A by 45° in phases.

FIG. 6C depicts four-phase clock signals O_CLKA, O_CLKB, O_CLKAX, and O_CLKBX in a case where the phase code PH6 is "125°". The four-phase clock signals O_CLKA, O_CLKB, O_CLKAX, and O_CLKBX of FIG. 6C are delayed in relation to the four-phase clock signals I_CLKA, I_CLKB, I_CLKAX, and I_CLKBX of FIG. 6A by 125° in phases.

Figure 7A:
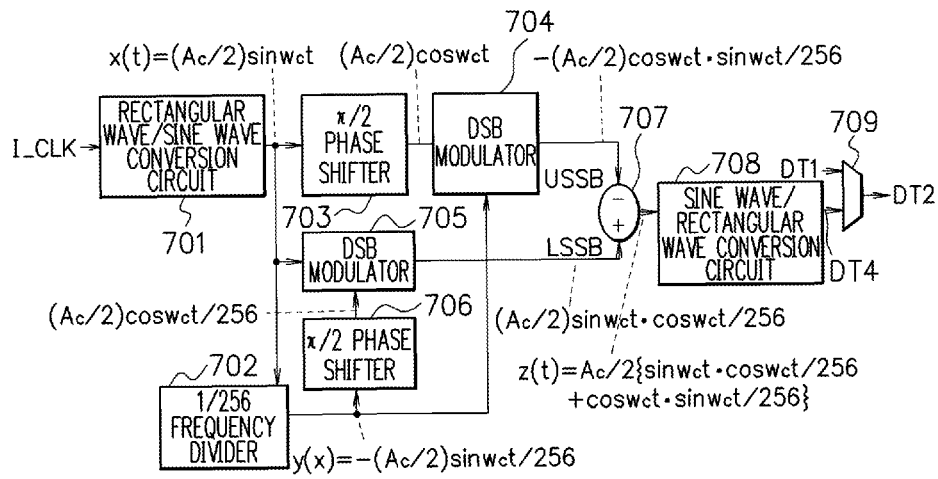
FIG. 7A is a diagram which depicts a configuration example of a calibration signal generation means of FIG. 1.
Figure 7B:
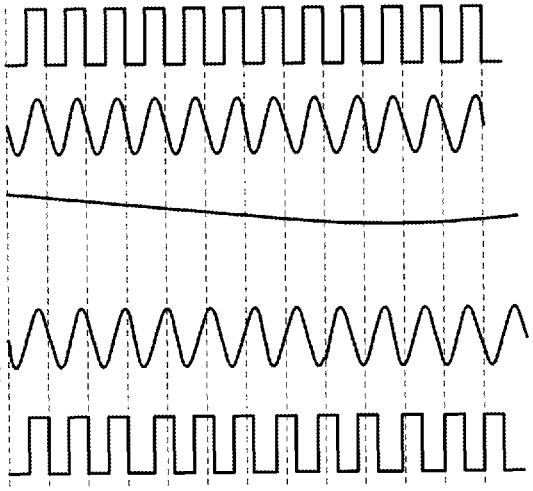
FIG. 7B is a timing chart for explaining an operation of the calibration signal generation means of FIG. 7A.

FIG. 7A is a diagram which depicts a configuration example of the calibration signal generation means 103 of FIG. 1, and FIG. 7B is a timing chart for explaining an operation of the calibration signal generation means 103 of FIG. 7A. A rectangular wave/sine wave conversion circuit 701 converts a clock signal I_CLK from a rectangular wave into a sine wave and outputs a sine wave $x(t)=(A_c/2)\sin w_c t$. An operation speed of the rectangular wave I_CLK and the sine wave x(t) is $w_c/2\pi$ [Hz].

A frequency divider 702 frequency-divides the sine wave x(t) by 1/256, to generate a sine wave $y(x)=-(A_c/2)\sin w_c t/256$. A phase shifter 703 phase-shifts the sine wave x(t) by $\pi/2$, to output a signal of $(A_c/2)\cos w_c t$. A DSB (Double Side Band) modulator 704 DSB-modulates the signal of $(A_c/2)\cos w_c t$ and outputs a USSB (Upper Single Side Band) signal of $-(A_c/2)\cos w_c t\cdot\sin w_c t/256$.

A phase shifter 706 phase-shifts the sine wave y(t) by $\pi/2$ and outputs a signal of $(A_c/2)\cos w_c t/256$. A DSB modulator 705 DSB-modulates the signal of $(A_c/2)\cos w_c t/256$ and outputs a LSSB (Lower Single Side Band) signal of $(A_c/2)\sin w_c t\cdot\cos w_c t/256$. A subtracter 707 subtracts the USSB signal from the LSSB signal and outputs a signal $z(t)=A_c/2[\sin w_c t\cdot\cos w_c t/256+\cos w_c t\cdot\sin w_c t/256]$. An operation speed of the signal z(t) is $(1+1/256)w_c/2\pi$ [Hz]. A sine wave/rectangular wave conversion circuit 708 converts the signal z(t) into a rectangular wave and outputs calibration data DT4. The calibration data DT4 has a frequency the same as that of the signal z(t), and has a frequency offset of $w_c/256$ in relation to the clock signal I_CLK.

A selector 709 selects the calibration data DT4 when the signal ST_EN is an ON signal and selects the reception data DT1 when the signal ST_EN is an OFF signal, outputting the data DT2.

Figure 8A:
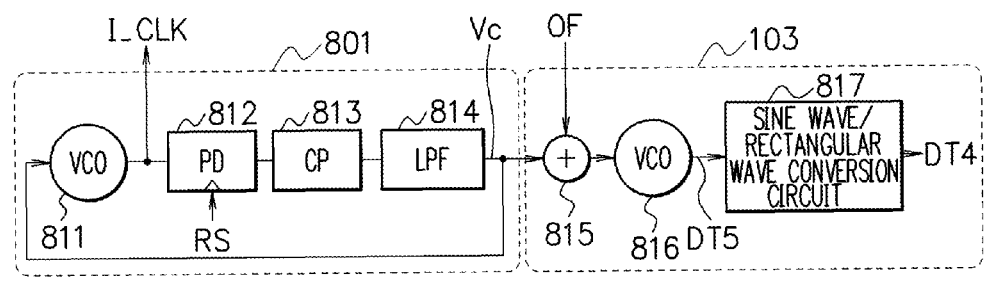
FIG. 8A is a diagram which depicts another configuration example of the calibration signal generation means of FIG. 1.
Figure 8B:
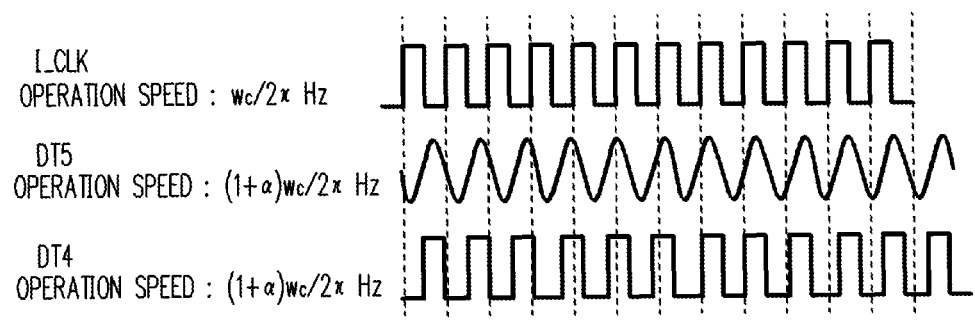
FIG. 8B is a timing chart for explaining an operation of the calibration signal generation means of FIG. 8A.

FIG. 8A is a diagram which depicts another configuration example of the calibration signal generation means 103 of FIG. 1, and FIG. 8B is a timing chart for explaining an operation of the calibration signal generation means 103 of FIG. 8A.

A phase locked loop (PLL) circuit 801 has a voltage-controlled oscillator (VCO) 811, a phase detector (PD) 812, a charge pump (CP) 813, and a low-pass filter (LPF) 814, and generates a clock signal I_CLK. A reference signal RS is inputted to the phase detector 812. The low-pass filter 814 outputs a control voltage Vc. The voltage-controlled oscillator 811 generates a clock signal I_CLK of a frequency corresponding to the control voltage Vc. An operating frequency of the clock signal I_CLK is $w_c/2\pi$ [Hz].

The calibration signal generation means 103 has an adder 815, a voltage-controlled oscillator (VCO) 816, and a sine wave/rectangular wave conversion circuit 817. The adder 815 adds the control voltage Vc and an offset OFF and outputs. The voltage-controlled oscillator 816 generates calibration data DT5 of a frequency corresponding to an output voltage of the adder 815. An operating frequency of the calibration data DT5 is $(1+\alpha)w_c/2\pi$ [Hz]. The sine wave/rectangular wave conversion circuit 817 converts calibration data DT5 of a sine wave into calibration data DT4 of a rectangular wave. An operating frequency of the calibration data DT4 is $(1+\alpha)$ $w_c/2\pi$ [Hz]. The calibration data DT4 has a frequency offset of $\alpha w_c$ in relation to the clock signal I_CLK. Similarly to in FIG. 7A, the selector 709 selects reception data DT1 or calibration data DT4 and outputs the data DT2.

Figure 9:
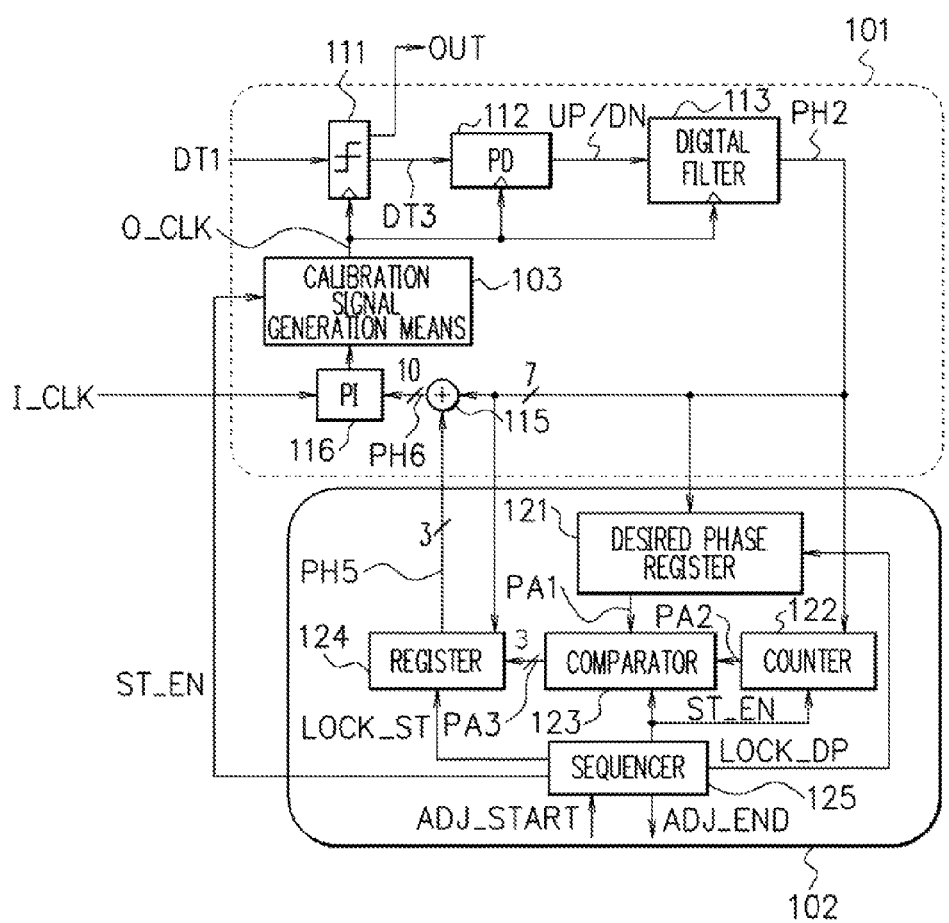
FIG. 9 is a diagram which depicts a configuration example of another reception circuit.

FIG. 9, corresponding to FIG. 1, is a diagram which depicts a configuration example of another reception circuit. In the reception circuit of FIG. 9, a position of a calibration signal generation means 103 is different from that of the reception circuit of FIG. 1. Hereinafter, points in which FIG. 9 is different from FIG. 1 will be described. A judgment circuit 111 inputs reception data DT1 instead of data DT2. The calibration signal generation means 103, when a signal ST_EN is an ON signal, outputs a clock signal O_CLK obtained by granting an offset frequency to a clock signal outputted by a phase adjustment circuit 116 to the judgment circuit 111, a phase detector 112, and a digital filter 113. Further, when the signal ST_EN is an OFF signal, a clock signal outputted by the phase adjustment circuit 116 is directly supplied to the judgment circuit 111, the phase detector 112, and the digital filter 113. In a calibration mode, an offset frequency is granted to the clock signal O_CLK instead of the data DT2. The reception circuit of FIG. 9 can perform an operation similar to that of the reception circuit of FIG. 1.

FIG. 10, corresponding to FIG. 1, is a diagram which depicts a configuration example of still another reception circuit. In the reception circuit of FIG. 10, a position of a calibration signal generation means 103 is different from that of the reception circuit of FIG. 1. Hereinafter, points in which FIG. 10 is different from FIG. 1 will be described. A judgment circuit 111 inputs reception data DT1 instead of data DT2. The calibration signal generation means 103, when a signal ST_EN is an ON signal, outputs a clock signal obtained by granting an offset frequency to a clock signal I_CLK to a phase adjustment circuit 116. Further, when the signal ST_EN is an OFF signal, the clock signal I_CLK is directly supplied to the phase adjustment circuit 116. In a calibration mode, an offset frequency is granted to a clock signal O_CLK instead of the data DT2. The reception circuit of FIG. 10 can perform an operation similar to that of the reception circuit of FIG. 1.

As described above, a phase detection unit has the phase detector 112 and the digital filter 113, and detects a phase code PH2 based on a phase of data DT3 in relation to a first clock signal O_CLK. The calibration signal generation means (unit) 103, in a calibration mode, adjusts the frequency of the first clock signal O_CLK or the data DT3 so that the phase code PH2 detected by the phase detectors 112, 113 changes.

In FIG. 1, the phase adjustment circuit 116 generates the first clock signal O_CLK based on the second clock signal I_CLK. The calibration signal generation unit 103 outputs the signal obtained by granting the frequency offset to the second clock signal I_CLK as the data DT2.

In FIG. 9, the calibration signal generation unit 103 outputs the signal obtained by granting the frequency offset to the clock signal outputted by the phase adjustment circuit 116 as the first clock signal O_CLK.

In FIG. 10, the calibration signal generation unit 103 outputs the signal obtained by granting the frequency offset to the second clock signal I_CLK as the third clock signal. The phase adjustment circuit 116 generates the first clock signal O_CLK based on the third clock signal.

The calibration circuit 102, in a calibration mode, records a difference PA3 between the phase code PH2 detected by the phase detectors 112, 113 and an ideal value as a calibration value PH5 per a detected phase PH2, and in a normal operation mode, outputs the calibration value PH5 in correspondence with the phase code PH2 detected by the phase detectors 112, 113. The phase adjustment circuit 116, in the normal operation mode, adjusts the phase of the first clock signal O_CLK based on the phase code PH2 detected by the phase detectors 112, 113 and the calibration value PH5.

The judgment circuit 111, synchronizing with the first clock signal O_CLK, performs binary judgment of the data DT1 or DT2. The phase detectors 112, 113 detect the phase code PH2 based on the phase of the data DT3 judged by the judgment circuit 111. The phase detector 112 detects phase information UP/DN of the data DT3 in relation to the first clock signal O_CLK. The digital filter 113 filters the phase information UP/DN detected by the phase detector 112 and outputs the phase code PH2.

As a result that the calibration signal generation unit 103 and the calibration circuit 102 are provided, the phase distortion of the phase adjustment circuit 116 can be calibrated at a high accuracy.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A reception circuit comprising:
 a phase detector that detects a phase code based on a phase of data in relation to a first clock signal;
 a calibration signal generator that, in a calibration mode, adjusts a frequency of the first clock signal or the data so that the phase code detected by the phase detector changes;
 a calibrator that, in the calibration mode, stores a difference between the phase code detected by the phase detector and an ideal value of the detected phase, and that, in a normal operation mode, outputs the ideal value in correspondence with the phase code detected by the phase detector; and
 a phase adjustor that, in the normal operation mode, adjusts a phase of the first clock signal based on the phase code detected by the phase detector and the ideal value, and that outputs to the phase detector.

2. The reception circuit according to claim 1, further comprising
 a judgment circuit that performs binary judgment of the data in synchronicity with the first clock signal,
 wherein the phase detector detects a phase code based on a phase of the data judged by the judgment circuit.

3. The reception circuit according to claim 1,
 wherein the phase detector has:
  a first phase detector that detects the phase of data in relation to the first clock signal; and
  a filter that filters the phase detected by the first phase detector and outputs the phase code.

4. The reception circuit according to claim 1,
 wherein the phase adjustor generates the first clock signal based on a second clock signal, and
 wherein the calibration signal generator outputs a signal obtained by granting a frequency offset to the second clock signal as the data to the phase detector.

5. The reception circuit according to claim 1,
 wherein the calibration signal generator outputs a signal obtained by granting a frequency offset to the clock signal outputted by the phase adjustor as the first clock signal to the phase detector.

6. The reception circuit according to claim 1,
 wherein the calibration signal generator outputs a signal obtained by granting a frequency offset to a second clock signal as a third clock signal, and
 wherein the phase adjustor generates the first clock signal based on the third clock signal.

* * * * *